United States Patent [19]

Shaw

[11] 4,224,574
[45] Sep. 23, 1980

[54] DIGITAL FREQUENCY QUADRUPLER
[75] Inventor: Mark L. Shaw, Mesa, Ariz.
[73] Assignee: Motorola, Inc., Schaumburg, Ill.
[21] Appl. No.: 946,474
[22] Filed: Sep. 28, 1978
[51] Int. Cl.$^2$ .......................... H04B 1/00; H03K 5/00; H04B 7/00
[52] U.S. Cl. ...................... 328/38; 328/169; 307/220 R; 307/225 R
[58] Field of Search .................. 328/38, 169; 307/220, 307/225

[56] References Cited
U.S. PATENT DOCUMENTS

| | | | |
|---|---|---|---|
| 3,832,640 | 8/1974 | Cederquist et al. | 328/38 |
| 3,835,396 | 9/1974 | Demos et al. | 328/38 |
| 3,935,539 | 1/1976 | Linder | 328/38 |
| 4,017,719 | 4/1977 | Kaplan et al. | 328/38 |
| 4,025,866 | 5/1977 | Fletcher et al. | 328/38 |
| 4,072,904 | 2/1978 | Casner et al. | 307/225 R |

*Primary Examiner*—Saxfield Chatmon, Jr.
*Attorney, Agent, or Firm*—Vincent B. Ingrassia

[57] ABSTRACT

A digital frequency quadrupler which provides output pulses at a rate equal to four times the number of input pulses. The input frequency range is extended by logic which allows additional pulses to be inserted in the output as the input frequency increases causing overlap between adjacent pulses. When the maximum upper range limit is reached the quadrupler saturates, that is, the output frequency becomes constant.

4 Claims, 3 Drawing Figures

DIGITAL FREQUENCY QUADRUPLER

FIELD OF THE INVENTION

The invention relates to a frequency quadrupler for use in improving resolution, duty cycle range, and maximum frequency range where the input signal is frequency variable.

BACKGROUND OF THE INVENTION

In applications where the incoming frequency of a signal must be counted and immediately processed, the resolution of the count may be severely reduced if the input frequency range includes frequencies which are too low. One method of increasing the number of counting samples per unit of time without reducing the resolution is to provide frequency multiplication. Traditionally this has been done with complex phase-locked loops or simple edge detecting doublers. One of the problems with traditional edge detection doublers is that as the input frequency increases, the doubler may fail within the frequency range of interest. Such a failure in automotive speed controls would be highly undesirable, since it would probably lead to a runaway speed condition.

SUMMARY OF THE INVENTION

These and other problems associated with the prior art have been overcome in the instant invention by the use of a digital quadrupler multiplier which improves resolution by a factor of 4 to 1 and prevents frequency drop off at the upper end of the range by inserting extra pulses in the output as a function of sensing coincident pulses within the multiplier. The circuit provides a pseudo multiplying of the input frequency by four by using the edge detection method. The improved quadrupler has a saturation detector to extend both the frequency range and the allowable variations in input frequency duty cycle before multiplication failure.

Therefore, it is an object of the invention to provide an improved resolution in a frequency counting system.

It is another object of the invention to increase the maximum operating range with respect to an input signal frequency.

it is yet another object of the invention to provide a constant output frequency when the input signal goes above a maximum allowable input frequency.

These and other objects of the invention will become more clear upon study of the detailed disclosure of the invention and the Figures in which.

DETAILED DISCLOSURE OF THE INVENTION

Figure 1:
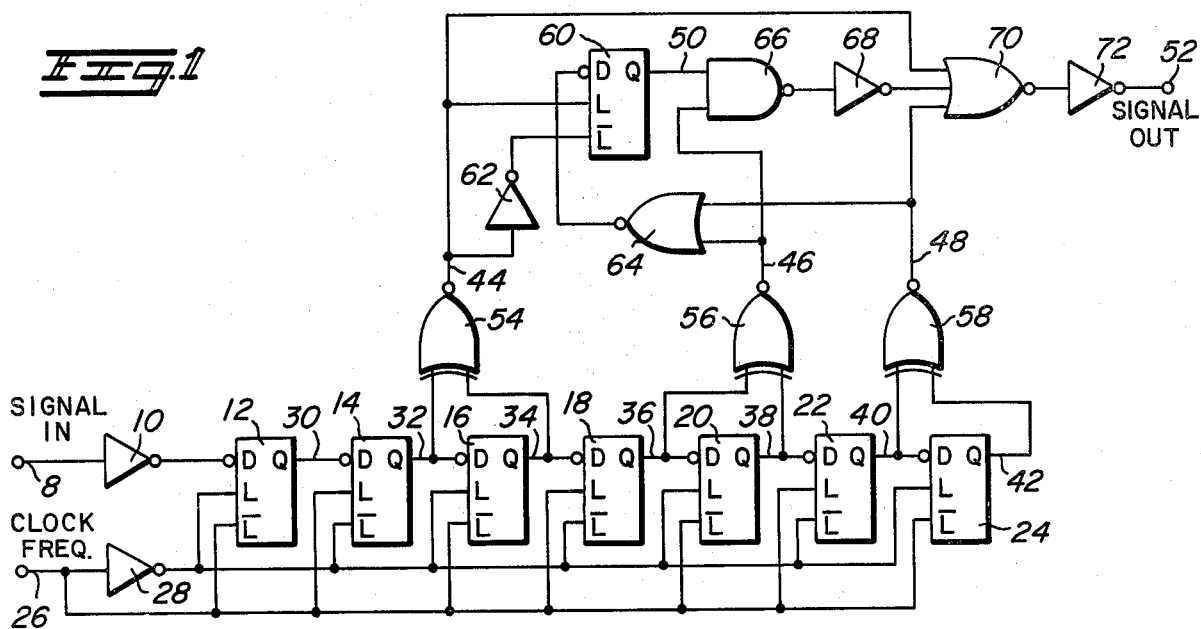
FIG. 1 is a logic diagram of the preferred embodiment of the invention.
Figure 2:
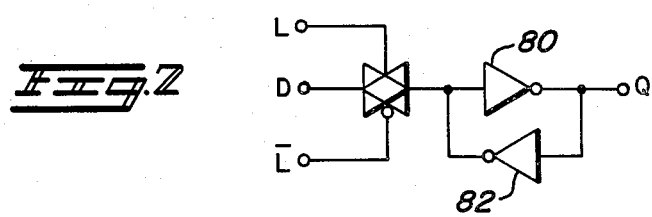
FIG. 2 is a diagramatic representation of the latch circuits of FIG. 1 as implemented in CMOS technology.
Figure 3:
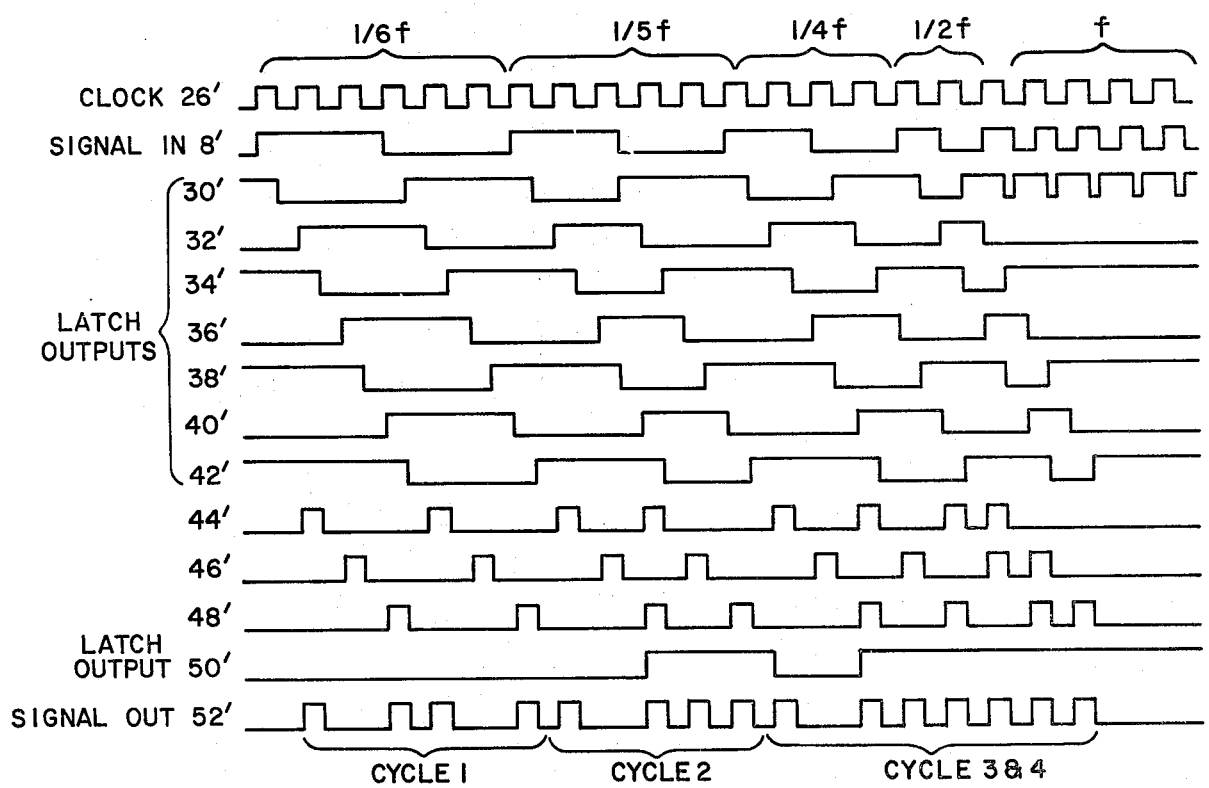
FIG. 3 is a timing diagram of the logic circuit of FIG. 1.

Referring to FIG. 1, the basic logic of the invention is shown. Input signal 8, having a broad frequency range, is fed into buffer 10 whose output feeds a series chain of D-type latches 12, 14, 16, 18, 20, 22, 24. The construction of latches 12-24 is shown in FIG. 2 diagramatically and represents the preferred embodiment in CMOS structure. In FIG. 2 inverter 82 preferrably has a lower amplification factor than inverter 80. Whenever the L input is HIGH and the L̄ input is LOW, the level at the D input will appear inverted at the Q output. If the state of the L and L̄ inputs invert, the state of the D input at the time of transition is retained inverted at the Q output. The L and L̄ inputs are driven by a clock signal at input terminal 26 having a frequency F. Inverter 28 is used to generate an out of phase clock. On alternate stages of latches 12-24 the data input D is enabled on alternate phases of clock signal 26. The resulting waveforms for latch chain 12-24 are shown in FIG. 3. Primed reference numerals at the left of FIG. 3 correspond to the unprimed reference numerals in FIG. 1, that is, reference numeral 30' at the left side of FIG. 3 indicates that the waveform to the right of that reference numeral corresponds to the waveform which would be expected at circuit point 30 in FIG. 1. Exclusive NOR circuit 54 is fed from latch chain circuit points 32 and 34, the Q outputs of D flip-flop 14, 16, respectively. Exclusive NOR circuit 56 is fed from circuit points 36, 38, the Q outputs of D flip-flops 18 and 20, respectively. Exclusive NOR circuit 58 is fed from circuit points 40 and 42, the Q outputs of D flip-flops 22 and 24, respectively. Output 44 of exclusive NOR circuit 54 is fed through buffer 62 to the L̄ input of D flip-flop 60. Output 44 of exclusive NOR circuit 54 is also fed to the L input of D flip-flop 60 and to one of the inputs to NOR gate 70. NOR gate 64 is fed from outputs 46 and 48 of exclusive NOR circuits 56 and 58, respectively. Output 46 of exclusive NOR gate 56 is also fed to one of the inputs of NAND gate 66. The output of NOR gate 64 is fed to the D input of D flip-flop 60. The Q output of D flip-flop 60 is fed via connection 50 to another input of NAND gate 66. The output of NAND gate 66 is fed to inverter 68. The output of inverter 68 is fed to another of the inputs of NOR gate 70. The output of NOR circuit 58 is fed to still another input of NOR gate 70. The output of NOR gate 70 is inverted by inverter 72 and this inverted signal appears on signal output terminal 52. This completes the circuit description of FIG. 1.

The operation of the circuit of FIG. 1 may best be understood in conjunction with FIG. 3. The reader should note that the waveforms of FIG. 3 represent the operation of the circuit of FIG. 1 over a range of frequencies, which are noted at the top of the Figure. Signal frequency 8' may be seen to occur at the rate of one full cycle for each six cycles of clock 26' and over that range FIG. 3 is suitably marked in the bracketed area as 1/6 f. In the bracketed area marked 1/5 f it will be noted that one complete cycle of signal 8' occurs during the period of five cycles of clock signal 26'. Similar relationships are shown at bracketed areas ¼ f and ½ f and finally, f of FIG. 3. Although FIG. 3 shows coincidence between the leading edges of signal 8' and clock signal 26' over most of the waveform shown, this is not always the case. First D-latch 12 is used to account for input signal 8' being in either of the binary states. For example, in the bracketed area marked f the two signals are out of phase. This out of phase condition may and will occur anywhere, since the phase relationship of the clock signal and the input signal are not synchronized. The signals shown in FIG. 3 as 30', 32', 34', 36', 38', 40' and 42' represent those signals at points 30, 32, 34, 36, 38, 40 and 42, respectively, in the circuit diagram of FIG. 1. These are the output signals from latches 12, 14, 16, 18, 20, 22 and 24, respectively. Exclusive NOR gate 54 compares signals 32' and 34' and output signal 42' represents coincidence between input signals 32' and 34'. When signals 32' and 34' are the same, that is; both signals are either high or low, signal 44' will be high as shown. When signals 32' and 34' are different, that is, one is high and one is low, signal 44' is low. Similarly signal 46' which is generated at output 46 of exclusive NOR gate 56 represents the coincidence of inputs 36' and 38' to exclusive NOR gate 56. When signals 36' and 38' are both high or both low, output 46' is high. When signals 36' and 38' are different, that is, when one is high and one is low, signal 46' will be low. Signal 48' represents the signal at output 48 of exclusive NOR gate 58 (see FIG. 1). Again, when inputs 40' and 42' to exclusive NOR gate 58 are both high or both low, signal 48' at output 48 will be high. When signals 40' and 42' are different; that is, where one is high and the other is low, output signal 48' from exclusive NOR gate 58 will be low as shown.

FIG. 2 shows in diagramatic form a typical latch such as 12, 16, 18, 20 or 24. The characteristics of such a latch are as follows: (1) if the L input is high, then the Q output is equal to $\overline{D}$. (2) if the L input is low then the Q output is equal to the last $\overline{D}$ at the time of the high to low transition of L.

It will be understood, then, that Q follows $\overline{D}$ as long as L is high and Q latches to the $\overline{D}$ level at the time when L goes low.

Again, referring to FIG. 3, it will be seen that output signal 52' is high when signal 44' or 48' is high so long as the input signal frequency is 1/6 f or lower. This provides an output signal 52' with four output pulses for each full cycle of input signal 8', as may be seen from FIG. 3, in the area marked as cycle 1. These output pulses occur when exclusive NOR gates 54 and 58 (FIG. 1) sense coincidence between signals 32', 34' and 40', 42', respectively.

When input frequency 8' goes as high as 1/5 f (see FIG. 3, cycle 2), the first output pulse is generated by the coincidence of signals 32' and 34' as in the 1/6 f case. The second output pulse is generated by exclusive NOR gate 54 (FIG. 1) and is coincident with the corresponding pulse of signal 44', as was the case in the cycle 1 area (1/6 f). The second output pulse is also coincident with signal 48'. The third output pulse in cycle 2 is generated by exclusive NOR gate 56 and is coincident with the corresponding pulse of signal 46'. This third pulse is inserted because output of D flip-flop 60 is high. The fourth cycle 2 output pulse is again generated by exclusive NOR gate 58 and is coincident with the corresponding pulse of signal 48'.

As the frequency of input signal 8' increases to ¼ f and ½ f it may be seen that output signal 52' finally saturates and is limited to clock frequency 26' as shown at the right end of 52' in the cycle 3 and 4 area.

It will be clear, then, that if the clock frequency is chosen to exceed the expected maximum input frequency by a factor of at least four to one, the output siganl pulses will occur four times for each full input signal cycle. If the input frequency should exceed one-fourth of the clock signal frequency, the output pulses saturate at the repetition rate of the clock. That is, the output pulse rate increases at four times the input frequency but is limited to the clock pulse frequency. This means that there is no total breakdown of the input/output frequency relationship, but that the output pulses increase at a rate four times the input signal frequency until they saturate at a constant frequency equal to the clock pulse rate.

When the invention is used in a system for sensing a signal proportional to vehicle speed, the output frequency begins to limit or saturate when the input signal reaches a frequency equal to ¼ the clock frequency, as shown in the cycle 3 and 4 area of FIG. 3. Between ¼ and ½ of the reference clock frequency, the system saturates and the output is constant at the reference frequency. When the input frequency exceeds ½ the clock reference frequency, the output may finally become unstable. This condition may be avoided by simply providing a clock which is at least twice the highest expected input signal frequency and complete linearity of output versus input may be obtained if the clock frequency is chosen to be at least four times the highest expected input frequency.

The duty cycle of the input signal is limited only in that the high or low portion of the input signal may not be of less duration than the period of one reference clock cycle. The input signal frequency at which the output frequency saturates is greater than the corresponding input frequency in an uncompensated version of an edge detection quadrupler and, in an uncompensated system, the output fails altogether, that is, it may drop to zero. In a vehicular speed control system it is important to prevent an output signal failure or frequency reversal within the expected operating range since this may lead to unsafe or even dangerous operation of the vehicle. In the present system it is possible to set the reference clock frequency high enough so that quadrupler failure can only occur beyond the operating range requirements of the system. The range of the system is extended by sensing signal coincidence which would cause output signal failure in a conventional prior art edge detection. This sensing detection of the potential failure triggers insertion of an extra pulse or pulses to maintain the desired fixed ratio of output pulses for each input cycle over the design operating range, thereby preventing failure by extending the range.

While the invention has been particularly shown and described with reference to a preferred embodiment thereof, it will be understood by those skilled in the art that various modifications and changes may be made to the present invention from the principles described herein without departing from the spirit ánd scope thereof as encompassed in the accompanying claims. Therefore, it is intended that the appended claims cover all such equivalent variations as come within the scope of the invention as described.

What is claimed is:

1. A method for improving the operating range of a frequency multiplier having input and output signals, comprising steps of:
   detecting the incoming signals;
   delaying the incoming signal in a plurality of series coupled clock controlled delay elements to produce a plurality of delayed signals;
   sensing coincidence between at least two of said delayed signals; and
   inserting extra pulses in the output of the multiplier responsive to the coincidence sensing step.

2. A method for improving the resolution and range of a frequency counter operating on an incoming signal where such incoming signal varies over a range of frequencies, comprising the steps of:
   generating a reference clock signal having a frequency higher than the highest frequency within the range of incoming frequencies;

converting the incoming signal to a two state, binary form;

delaying the converted incoming signal by means of a plurality of series coupled delay devices to produce a plurality of delayed signals;

sensing coincidence of said binary state of a plurality of pairs of said delayed signals and said clock pulse; and producing a plurality of pulses responsive to the coincidence sensing step.

3. The method according to claim 1 wherein said sensing step is responsive to four of said delay devices, each of said delay devices providing a serial delay equal to one clock frequency period.

4. The method according to claim 2 wherein said delay devices are latching devices.

* * * * *